United States Patent [19]

Miller et al.

[11] Patent Number: 5,120,992
[45] Date of Patent: Jun. 9, 1992

[54] CMOS OUTPUT DRIVER WITH TRANSITION TIME CONTROL CIRCUIT

[75] Inventors: William E. Miller, Los Gatos; Franklin S. Ho, San Carlos, both of Calif.

[73] Assignee: National Semiconductor Corporation, Santa Clara, Calif.

[21] Appl. No.: 725,286

[22] Filed: Jul. 3, 1991

[51] Int. Cl.⁵ ........................................... H03K 19/003
[52] U.S. Cl. ................................... 307/270; 307/451; 307/473; 307/475; 307/443; 307/592; 307/263
[58] Field of Search ............... 307/270, 451, 473, 475, 307/592, 594, 597, 443, 263

[56] References Cited

U.S. PATENT DOCUMENTS

| | | | |
|---|---|---|---|
| 4,500,849 | 2/1985 | Nakayama | 330/264 |
| 4,728,903 | 3/1988 | Reiffin | 330/264 |
| 4,760,279 | 7/1988 | Saito et al. | 307/451 |
| 4,987,381 | 1/1991 | Butler | 330/264 |
| 4,990,802 | 2/1991 | Smodra | 307/443 |
| 5,034,629 | 7/1991 | Kinugasa et al. | 307/451 |

*Primary Examiner*—Stanley D. Miller
*Assistant Examiner*—Scott A. Ouellette
*Attorney, Agent, or Firm*—Flehr, Hohbach, Test, Albritton & Herbert

[57] ABSTRACT

A single resistance permits a CMOS driver to have output devices that controllably transition "fast off-slow on" and which are not simultaneously on while the driver switches states. The driver's output and supply currents contain reduced harmonics. The resistance is coupled to the gates of the output stage PMOS-NMOS devices, and forms an RC circuit with the intrinsic capacitance at the gates, extending the turn-on transition of the gate drive voltages. Each output device then turns on relatively slowly, but turns off normally. The output current transition times are essentially determined by the resistance and intrinsic capacitances. The resistance is implemented using polysilicon or diffusion, and preferably has a magnitude ten times the on-channel resistance of the input PMOS and NMOS devices driving the output stage. Because the resistance and intrinsic capacitances are essentially temperature and power supply voltage independent, and but slightly process dependent, the current output transition times can be controlled despite CMOS parameter variations. A 3-state embodiment of the CMOS buffer uses parallel coupled PMOS-NMOS devices to switchably couple in the resistance between both output gates when the enable signal is high. Second input PMOS and NMOS devices, connected in parallel across the first input PMOS and NMOS devices, turn on across the first input devices when the enable signal is low. A high enable signal enables the driver circuit, while a low enable signal uncouples the resistance and turns off both output PMOS and NMOS devices, putting the circuit's output in a high impedance state.

7 Claims, 7 Drawing Sheets

CMOS OUTPUT DRIVER WITH TRANSITION TIME CONTROL CIRCUIT

FIELD OF THE INVENTION

This invention relates to integrated logic circuits, and more particularly to integrated circuit CMOS drivers.

BACKGROUND OF THE INVENTION

Integrated circuit logic drivers and 3-state logic drivers using CMOS devices are well known. A logic driver circuit receives an input signal and provides an output signal that can be coupled to many other logic circuits. The purpose of the logic driver circuit is typically to drive a relatively large capacitive load, such as the load typically associated with the output pins of an integrated circuit.

A CMOS logic driver typically has an output stage that includes a PMOS transistor and an NMOS transistor coupled in series between two power sources. Ideally, only one of these two output transistors is on at any one time. Thus, when the input signal to a CMOS logic driver changes state, it is best if the PMOS and NMOS transistors switch in such as way that the two devices are never simultaneously on.

CMOS logic drivers are often implemented using integrated transistors which switch rapidly (often within 1-3 nanoseconds), even while driving capacitive loads. The harmonic content of the logic driver's output signal is a function of the rise and fall times of the output current signal. A smaller switching time represents a rapidly changing output current signal with many high frequency components, including harmonics.

Further, the high speed switching of the NMOS and PMOS output transistors can cause both of the output transistors to be on simultaneously during part of the transition time, thereby generating spikes in the circuit's supply current that aggravate harmonic generation. The resulting supply current signal has fast transition times, spikes and transients, and generally is rich in high frequency harmonics. These undesired harmonics radiate electromagnetic interference ("EMI") that can interfere with neighboring circuitry and indeed with circuitry external to the driver circuit.

Harmonic generation is difficult to control because CMOS parameters can vary fourfold with fabrication process tolerances, ambient temperature changes and power supply changes. While isolating EMI-generating CMOS devices from other circuitry may reduce the EMI problem, doing so is contrary to modern design philosophy. Integrated circuit designers today are encouraged to fabricate ever smaller, more densely packed and increasingly complex CMOS circuits within a given chip area.

SUMMARY OF THE INVENTION

The present invention reduces the amount of high frequency EMI generated by a CMOS logic driver. In particular, the present invention provides a CMOS logic driver in which the output transistors turn off at a faster rate than they turn on. The "fast off, slow on" operation of the CMOS output stage prevents the PMOS and NMOS device in the output stage from being on simultaneously. In general, the present invention decreases the rate of change of output current, reduces supply current spikes, and will thus minimize EMI.

A CMOS logic driver according to the present invention includes an input CMOS inverter stage and an output CMOS inverter stage. The input stage has a PMOS transistor, a resistor, and an NMOS transistor connected in series between two power sources, Vcc and Vss. The output stage is a CMOS inverter having a PMOS transistor and an NMOS transistor connected in series between Vcc and Vss.

The input stage receives an input signal and provides first and second drive signals to the output stage, one from each end of the input stage's resistor. The first drive signal is connected to the gate of the output stage's PMOS transistor, and the second drive signal is connected to the gate of the output stage's NMOS transistor.

The input stage's resistor is coupled across the gates of the output devices, and thus across the outputs of the input stage. The resistor cooperates with the intrinsic capacitance that exists at the gate of each output device to form an RC (i.e., resistance-capacitance) filter. This RC filter delays (or lengthens) each of the two drive signal only when the neighboring input transistor device turns off, but not when the neighboring input transistor turns on. In other words, the first drive signal is delayed only when the input signal switches from a low to a high voltage, and the second drive signal is delayed only when the input signal switches from a high to a low voltage. The result is that each output device turns on relatively slowly, but turns off relatively fast. In addition, the two output devices are never simultaneously on.

The transition times of the resulting output current waveform are essentially controlled by the RC filter. Since the resistance and intrinsic capacitances are largely voltage and temperature independent, and only slightly process dependent, the current waveform transition times can be controlled despite variations in the CMOS parameters.

It is an objective of the present invention to implement a CMOS driver and a 3-state CMOS driver having reduced harmonic content in the output current waveform, without appreciably increasing the chip area for this driver. This objective is met by adding a single input stage resistor to a CMOS driver configured as described, thereby causing each output device to turn on more slowly than it turns off. The resulting output current waveform has controllably slower transition times, and a simultaneously on condition for both output devices is prevented.

It is a further objective to implement such CMOS drivers so that EMI reduction is obtained despite variations in process, temperature and power supply voltage. This objective is met because the input stage resistor and cooperating intrinsic capacitances are essentially temperature and voltage independent, and are only slightly process dependent.

Other features and advantages of the invention will appear from the following description in which the preferred embodiments have been set forth in detail in conjunction with the accompanying drawings.

DETAILED DESCRIPTION OF THE PREFERRED EMBODIMENTS

Figure 1:
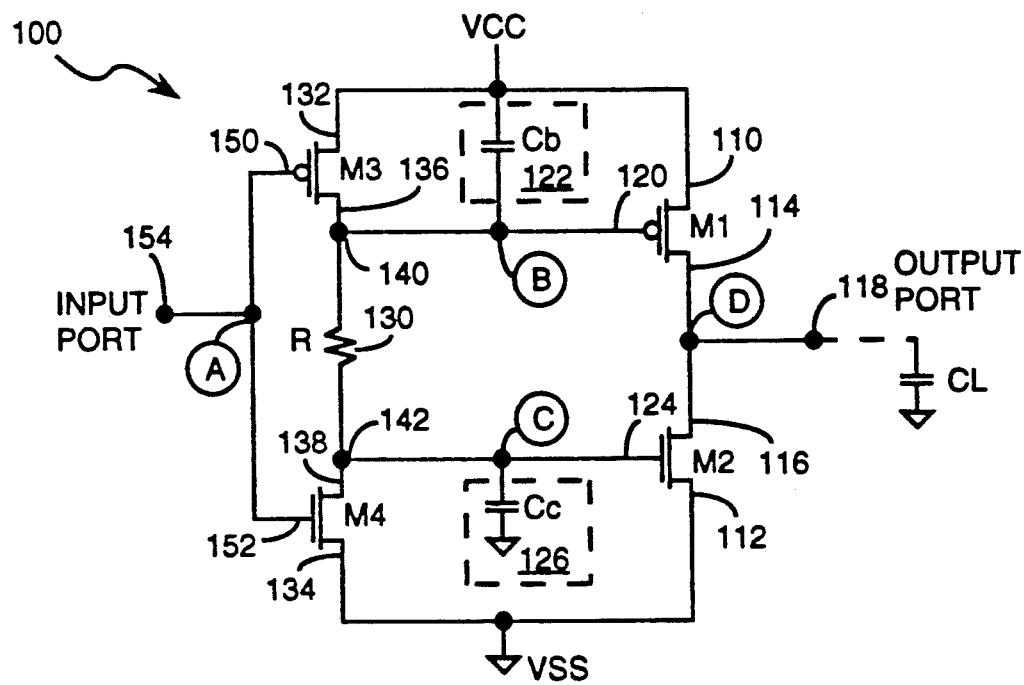
FIG. 1 is a schematic of a CMOS driver according to the present invention.

FIG. 1 shows a gradual turn-on CMOS driver 100 according to the present invention. The driver includes an output stage with PMOS transistor M1 and an NMOS transistor M2 coupled in series between a first power source Vcc and a second power source Vss. The source 110 of M1 is coupled to Vcc, the source 112 of M2 is coupled to Vss, and the drains 114 of M1 and 116 of M2 are coupled together to define an output port 118. M1 has a gate 120 at which an intrinsic capacitance Cb (shown as capacitor 122) is present, and M2 has a gate 124 at which an intrinsic capacitance Cc (shown as capacitor 126) is present.

The CMOS driver 100 further includes an input stage with PMOS transistor M3, resistor 130, and NMOS transistor M4 coupled in series between Vcc and Vss. The source 132 of M3 is coupled to Vcc, and the source 134 of M4 is coupled to Vss. The drains 136 and 138 of M3 and M4, respectively, are coupled to nodes 140 and 142, respectively, at opposite ends of the resistor 130. The gates 150, 152 of M3, M4 are coupled together and to the data input port 154.

Typically Vcc is a positive power source relative to Vss. In the preferred embodiment Vcc is typically set at +5 V and Vss is set of 0 V (also called ground). M1, M2, M3, M4 are preferably enhancement mode devices having identical sources and drains.

Depending upon the application, resistor 130 will have a resistance in the range of about 1 KΩ to about 10 KΩ, and may be fabricated as a polysilicon resistor, or using P+ or N+ diffusions. P+ diffusion resistors are preferred because P+ diffusion typically has a resistance of about 100 Ω/square whereas polysilicon and N+ diffusion typically have resistance in the range of 20 to 30 Ω/square. Resistor 130's resistance is preferably a magnitude or so greater than the on-channel resistance of the devices M3, M4. Thus, resistor 130 will generally have a resistance of no less than five times transistor M3's on-channel resistance.

The intrinsic capacitances Cb, Cc represent all the capacitance "seen" at the gates 120, 124 of the output devices and include the gatesource and the body capacitance of M1, M2. Typically Cb, Cc will be in the range of 0.1 to 1.0 pf or so. The resistance of resistor 130 together with Cb or Cc and the relatively negligible on-channel resistance of M3 or M4 form an RC filter whose time constant lengthens the voltage transitions that turn M1 and M2 on.

Figure 2A:
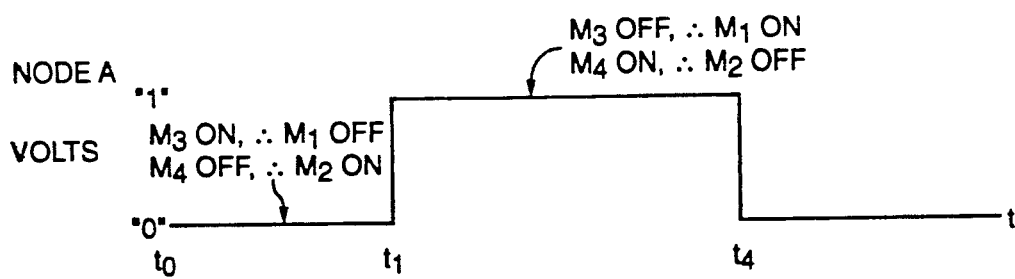
FIGS. 2A-2E depict waveforms present at various nodes in the circuit of FIG. 1.

Referring to FIGS. 2A-2E, operation of the CMOS driver will be explained using an example of an input signal at the input port 154 having the voltage waveform shown in FIG. 2A. For convenience, the input port 154 will be referred to as node A. Before time t1, node A is at a low or "0" logic state, which causes input PMOS device M3 to be on and input NMOS device M4 to be off.

Node 140, at the junction of the drain 136 of M3, gate 120 of M1, the top lead of resistor 130 and the intrinsic capacitance Cb, will be referred to as node B. Similarly, node 142 at the junction of drain 138 of M4, gate 124 of M2, the bottom lead of resistor 130 and the intrinsic capacitance Cc, will be referred to as Node C.

Figure 2B:
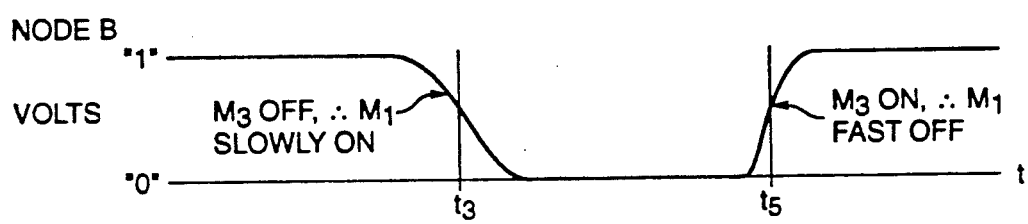
Figure 2C:
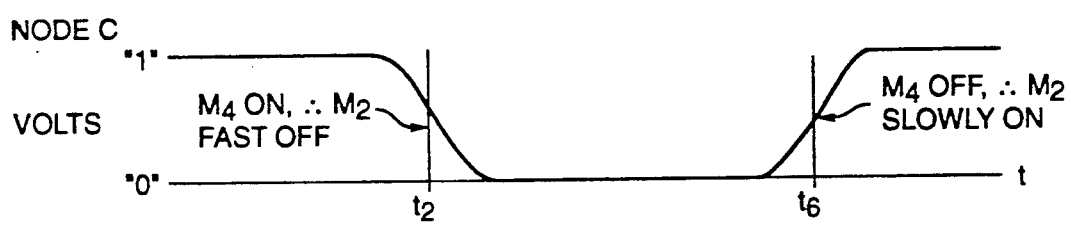
Figure 2D:
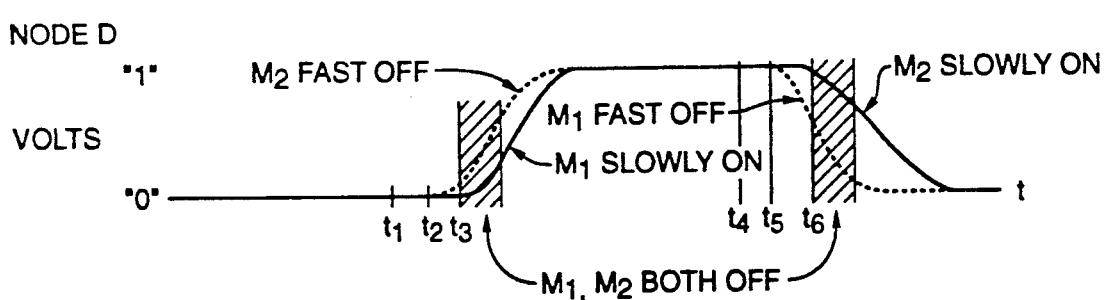

Referring to FIGS. 2B and 2D, before time t1, nodes B and C are high because M3 is on and M4 is off. Before time t1, the voltage signal at the output port 118 (defined as node D) is low because M1 is off M2 is on.

At time t1, the data input signal at node A transitions suddenly from a low to a high state. As node A rises sufficiently to turn M4 on and M3 off, the voltage at node B will decay relatively slowly to a low state. In particular, the RC filter formed by resistor 130 and intrinsic capacitance Cb will cause node 142 to discharge at a rate of approximately $e^{-t/RC}$, where t is time, R is the combined resistance of the resistor 130 and the on-channel resistance of transistor M4, and C is the intrinsic capacitance Cb. Cb discharges to Vss through R in series with the relatively small on-channel resistance of M4.

Comparing FIGS. 2B and 2C, at time t1 as the voltage at node A rises sufficiently to turn M4 on, the voltage at node C goes to a low state relatively rapidly. This node C transition to a low state is not delayed because capacitance Cc discharges through the relatively low on-channel resistance of M4.

As shown by FIG. 2D, M1 turns on relatively slowly (at about time t3) because the waveform at node B (e.g., the gate input voltage to M1) transitions relatively slowly from high to low due to R and Cb. However M2 turns off relatively rapidly (at about time t2) because the waveform at node C (the gate input to M2) transitions from high to low relatively rapidly. The result is that M2 turns off relatively rapidly while M1 turns on relatively slowly. Note too that M1 and M2 are never on simultaneously during this transition.

Consider now the circuit response at time t4, when the input signal at node A changes from high to low. When the voltage at node A drops sufficiently, M3 turns on and M4 turns off, causing the voltage at node B to rise rapidly from a low to a high state. This transition at node B is relatively rapid because Cb charges up to Vcc through the relatively low on-channel resistance of M3. Since the voltage at node B represents the gate input voltage to M1, the rapid low-to-high node B transition turns M1 off relatively rapidly (at time t5).

However when node A transitions from high to low at time t4, node C rises more slowly than node B rises. Intrinsic capacitance Cc must charge to Vcc through resistor 130 in series with the on-channel resistance of M3, and as a result, the low-to-high transition at mode C is relatively slow. Since the voltage at node C represents the gate input to M2, the slow low-to-high transition causes M2 to turn relatively slowly on (at time t6). Thus at time t4, M1 turns off relatively rapidly while M2 turns slowly on. Again the result is that the output devices M1 and M2 are not simultaneously on during transitions of the input signal at node A.

The actual output voltage waveform is a function of the current waveform and the output capacitive load CL:

$$\Delta V_{OUT} = \frac{1}{C_L} \int i_{out} dt$$

Since only $d(i_{out})/dt$ and not peak $i_{out}$ is being limited by the present invention, the output voltage transitions will only be slightly slower than they would have been without the presence of resistor 130.

It is interesting to note in FIG. 2D that while the output devices M1, M2 are never on simultaneously, they are off simultaneously for a very short period of time during transitions (see shaded regions in FIG. 2D). As node D rises from low to high, there is an interval wherein M2 has already turned off while M1 is slowly turning on. Similarly as node D decreases from high to low, there is an interval wherein M1 has rapidly turned off during while M2 is slowly turning on. These two periods of simultaneous off condition last but a few nanoseconds and do not adversely affect operation of the circuit of FIG. 1.

Figure 2E:
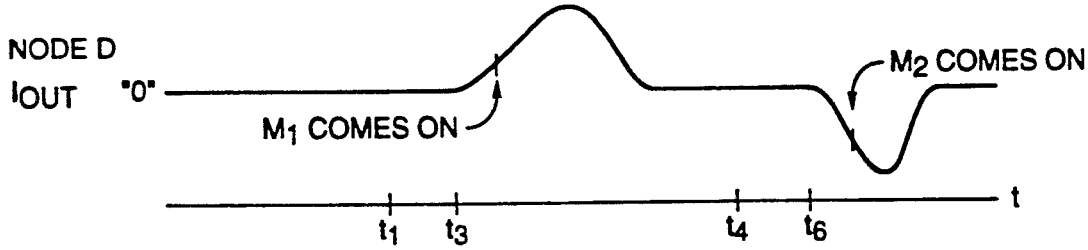

The output current waveform is shown in FIG. 2E. The transition times of the output current waveform are essentially determined by resistor 130 and intrinsic capacitances Cb or Cc. Since the RC time constants associated with these circuit components do not vary significantly with temperature and power supply voltage, and vary only slightly with process, the output current transition times can be controlled by properly setting the resistor of resistor 130, despite variation in the CMOS device characteristics. The relative magnitude of the current peaks is dependent upon the size of the output drivers M1 and M2, and is only dependent on the magnitude of the load capacitance CL, coupled between the output port 118 and Vss, if this capacitance is relatively small. Note the absence of relatively large supply current spikes after times t1, t4, because M1 and M2 are not simultaneously on. Depending upon the application, the output current transition times will typically be in the range of 7-8 ns, contrasted with 1-3 ns for a conventional CMOS driver.

Table 1 represents a computer simulation of the gradual turn on of the CMOS driver circuit 100 shown in FIG. 1 (denoted in Table 1 as the "GTO buffer"), contrasted with a standard buffer circuit. Data are presented for varying load capacitances CL and varying ambient temperatures. Note the significant decrease in the slope of the output current waveform, di/dt (ma/ns), for the present invention as contrasted with a standard buffer. For the output PMOS device M1 in FIG. 1, di/dt decreases by a ratio of about 8 as contrasted with the output PMOS device in a conventional CMOS buffer. For the output NMOS device M2 in FIG. 1, di/dt decreases by a ratio of about 4.5 at ambient temperatures above 90° C., and by a ratio of about 2.4 at −55° C.

Figure 3:
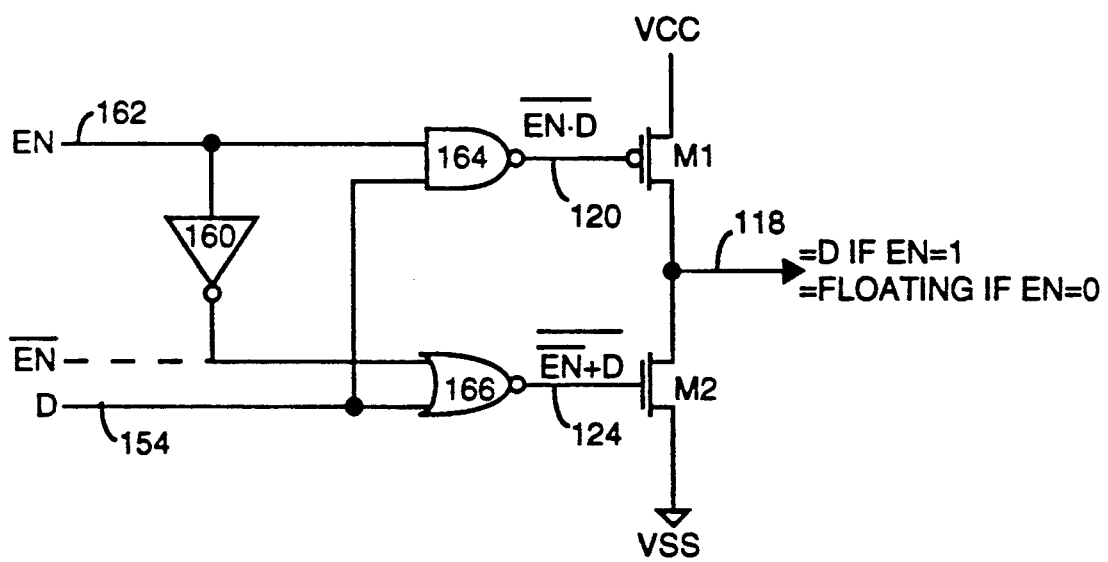
FIG. 3 is a logic diagram of a conventional 3-state CMOS driver circuit.

FIG. 3 is a logic diagram showing the implementation of a conventional CMOS 3-state driver. Typically implementation of FIG. 3 requires ten or more CMOS devices, depending upon whether the inverter 160 is part of the circuit. Unless both EN and $\overline{EN}$ input signals are available to the circuit, the circuit must include inverter 160, and will require twelve CMOS devices for implementation.

The driver of FIG. 3 receives the data signal at a data input port 154, and receives the enable signal EN at enable port 162. The implementation includes a NAND gate 164 and a NOR gate 166 whose respective outputs drive the output devices M1, M2. When EN=1 (e.g., high), the driver is "enabled" and the signal at the output port 118 will replicate the data input signal at port 154. Typically the rise and fall times of the current output waveform at port 118 can be in the 1-3 ns range. Further, for short periods during transitions, M1 and M2 can simultaneously be on, creating supply current surges or spikes, further aggravating the harmonic-EMI problem previously described. However when the enable signal is low (e.g., EN=0), M1 and M2 are both off, regardless of whether the input signal at port 154 is high or low. Thus, when EN=0, the output at port 118 is essentially floating, in a high impedance state, and the driver circuit is said to be "tristated" or disabled.

Figure 4:
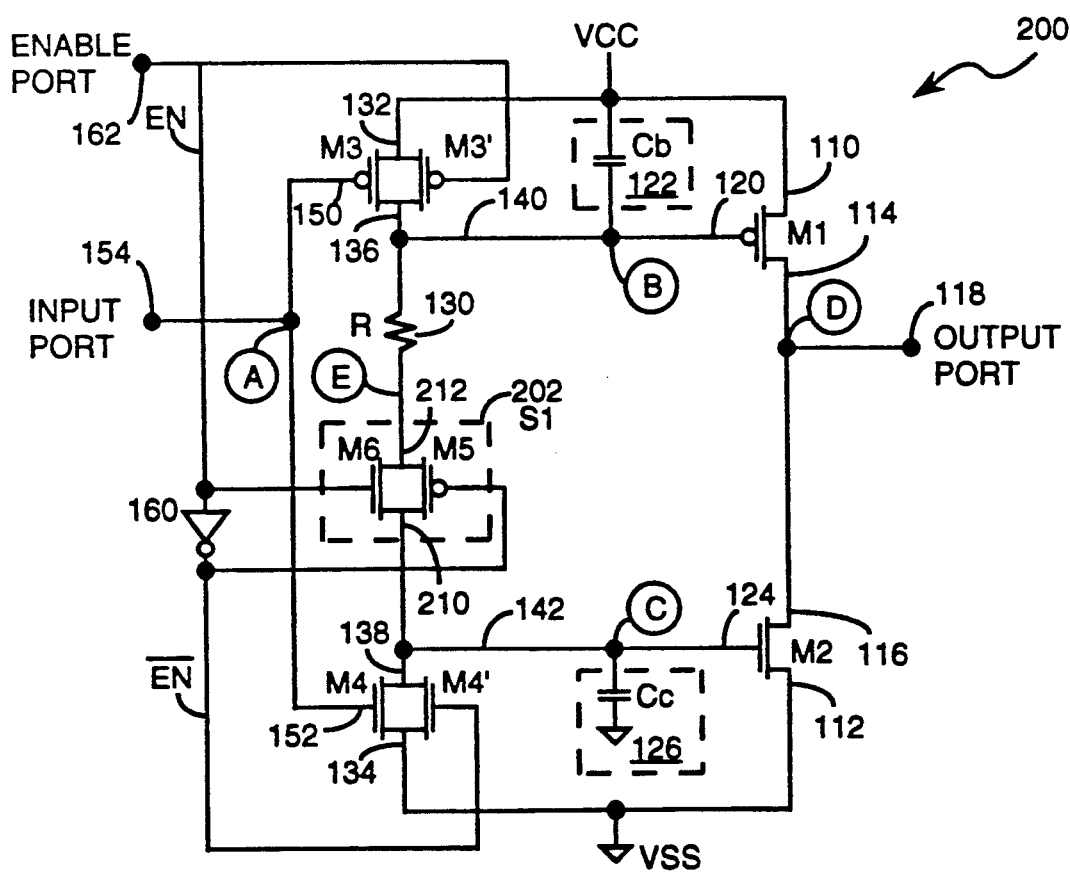
FIG. 4 is a schematic of a 3-state CMOS driver according to the present invention.

In contrast to the standard 3-state driver shown in FIG. 3, applicants' CMOS 3-state drive 200 shown in FIG. 4 requires only eight CMOS devices for implementation (assuming EN and $\overline{EN}$ signals are available to the circuit), and a resistor 130. Ten CMOS devices are needed if the compement of the EN signal is not available and needs to be generated using inverter 160. Not only does applicants' driver 200 require less chip space than a prior art 3-state driver, but applicants' 3-state driver turns on controllably slowly, and does not allow simultaneously on output devices. As a result, the harmonic content of the output current signal is reduced. The basic operational features of the gradual turn-on CMOS driver described earlier with reference to FIG. 1 also apply to the 3-state CMOS drive embodiment of FIG. 4.

The circuit of FIG. 4 includes output and input CMOS devices M1, M2, M3, M4 coupled in essentially the same manner as described above with respect to FIG. 1. However the circuit of FIG. 4 further includes an on-off switch S1 (shown as 202) that couples and uncouples the bottom lead resistor 130 to and from node C. S1 has two complementary inputs, EN and $\overline{EN}$. Enable signal EN is received at enable port 162. The complementary enable signal $\overline{EN}$ is generated by inverter 160, which may be either internal or external to the CMOS driver 200, depending on the particular circuit in which the driver 200 is being used.

Switch S1 is closed, coupling the second resistor 130 to node 142 (also called node C), whenever the enable signal EN is "1" or high. Switch S1 contains a complementary pair of CMOS transistor M5 and M6 coupled in parallel with one another. NMOS transistor M6 is gated by enable signal EN, and PMOS transistor M5 is gated by complementary enable signal $\overline{EN}$.

Node C is here defined as the junction of the drain 138 of M4, the gate 124 of M2, the intrinsic capacitance Cc, and a first output lead 210 of S1. S1 has a second output lead 212 coupled to the bottom lead of the resistor 130. The junction of the second switch lead 212 and resistor 130 will be defined as node E.

The 3-state driver 200 requires two additional CMOS devices to fully implement the disabling or "tristate" function: a second PMOS device M3' and a second NMOS device M4'. M3' is connected in parallel with transistor M3, and M4' is connected in parallel with transistor M4. The gate of M3' is coupled to the enable signal EN, and the gate of M4' is coupled to the complementary enable signal $\overline{EN}$.

Together M3', M4', M5 and M6 implement the NAND/NOR logic functions shown in FIG. 3. When EN=1, M3' and M4' are off, and M5 and M6 are on (closing switch S1 and coupling resistor 130 to node, thereby allowing the driver 200 to function normally. As a result, when EN=1, the CMOS driver 200 of FIG.

4 is enabled and "looks" like the circuit of FIG. 1 and functions similarly. Thus, the various waveforms shown in FIGS. 2A-2E are equally applicable for the 3-state driver of FIG. 4 when EN=1.

However when EN=0, M3' and M4' are both on, and M5 and M6 both turn off, opening switch S1, and breaking the signal path from M3 to M4. When M3' turns on, node B goes high, and M1 turns off. When M4' turns on, node C goes low and M2 turns off. Thus, when the enable signal EN=0, both output devices M1, M2 are off, and the output at port 18 floats because the circuit is disabled or "tristated".

Figure 5:
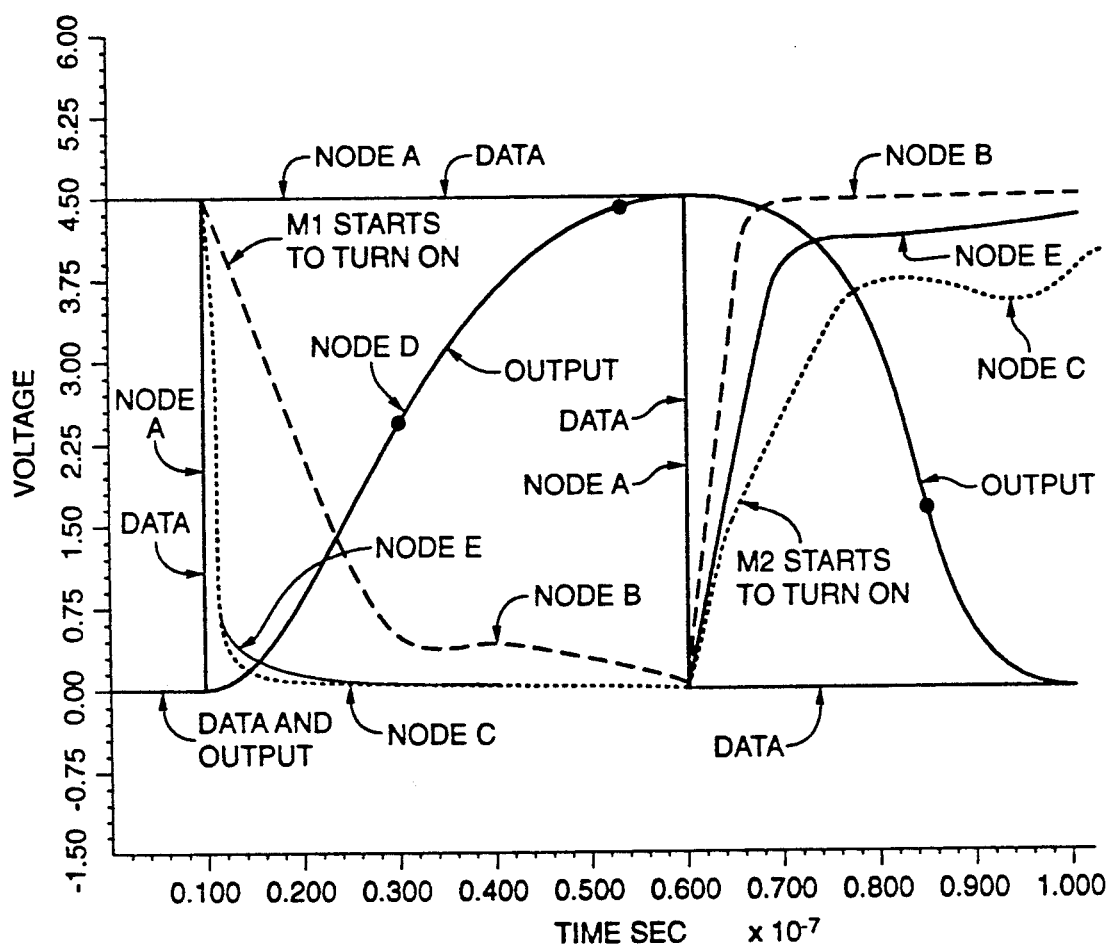
FIG. 5 depicts computer simulated waveforms at various nodes in the circuit of FIG. 4.

FIG. 5 shows superimposed voltage waveforms at various nodes in the 3-state CMOS driver of FIG. 3, according to a computer simulation where the output capacitive load CL is 100 pf, and ambient temperature is 130° C. Note that while the data input waveform at node A has transition times in the sub-nanosecond region, the output waveform at node D has about a 30 nanosecond rise and fall time, which is set primarily by the value of CL.

Figure 6A:
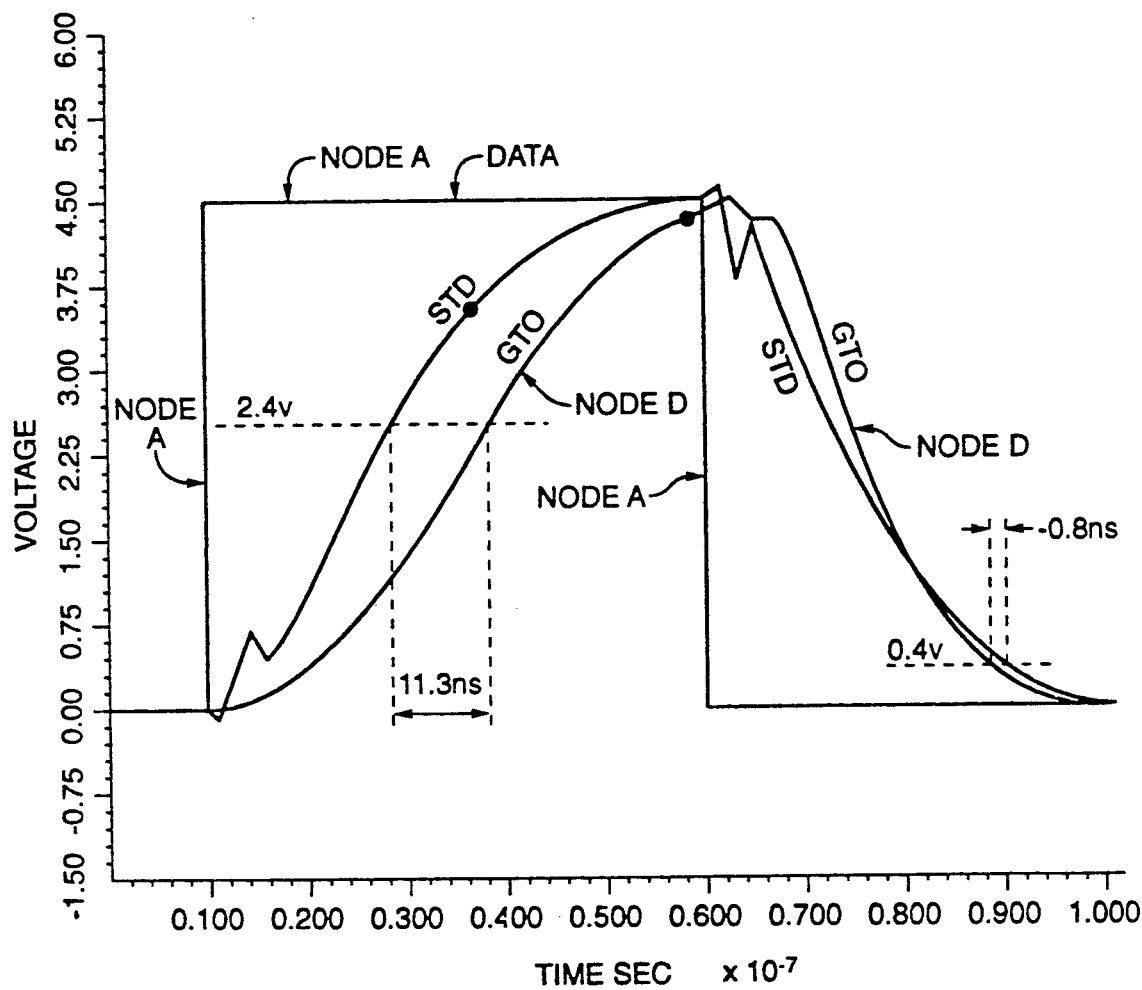
FIG. 6A shows computer simulated voltage waveforms for the circuit of FIG. 4 and for a prior art 3-state driver.

FIG. 6A shows superimposed node A and node D voltage waveforms for a conventional 3-state CMOS driver and for the circuit of FIG. 3. The waveforms in FIG. 6A are the result of a computer simulation, where CL is set to 100 pf, and the ambient temperature is set to 130° C. The output voltage rise time for the present invention (denoted as "GTO" in FIG. 6A) is about 23 ns contrasted with about 12 ns for the conventional circuit (denoted "STD"). The voltage fall time for each circuit is about 20 ns. Although FIG. 6A shows an approximately 11 ns delay in the voltage output low-to-high transition between the present invention and a prior art 3-state CMOS driver, this is mostly due to the reduction in size of the P-channel driver that was used in these simulations.

Figure 6B:
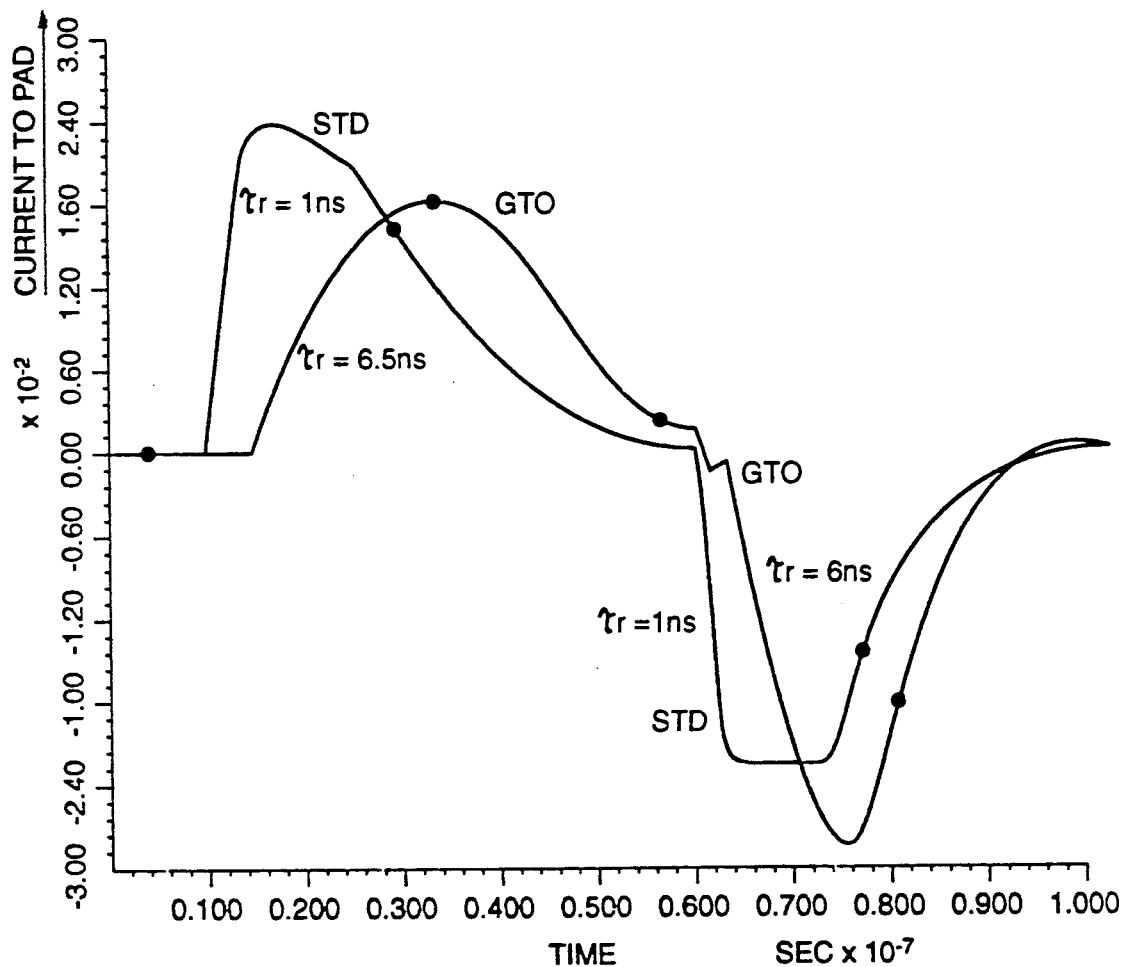
FIG. 6B shows computer simulated current waveforms for the circuit of FIG. 4 and for a prior art 3-state driver.

Note, however, the dramatic change in the output current waveforms shown in FIG. 6B. The conventional driver has current transition times of 1 ns or so, whereas the present invention has transition times of about 6 ns. Needless to say, the output current waveform for the present invention will include fewer harmonics, and will generate less EMI, than the conventional 3-state CMOS driver circuit. Further, the current output transition times for the present circuit are more controllably implemented than the transition times in the prior art circuit.

Figure 7:
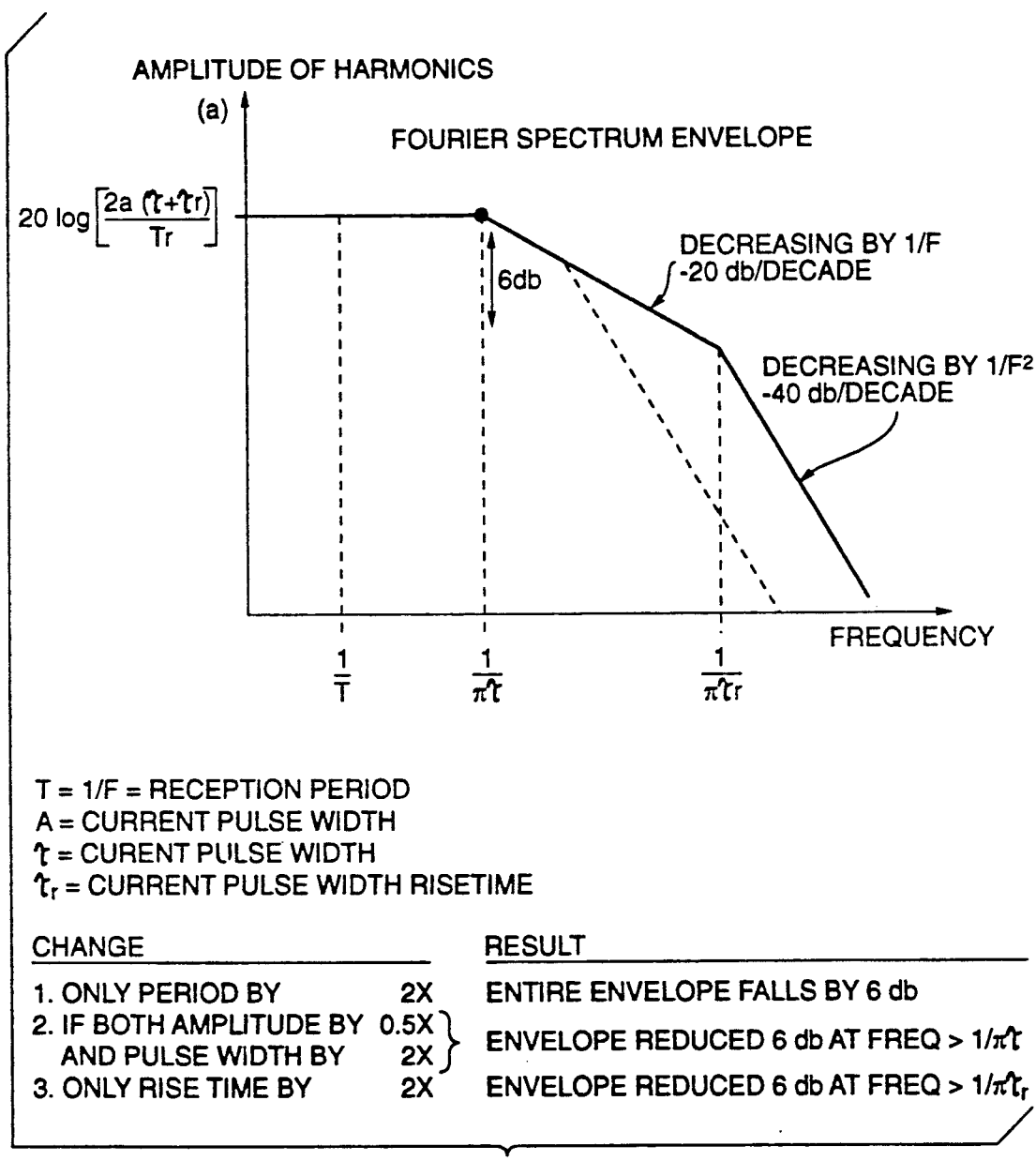
FIG. 7 is a Fourier spectrum model of an output current waveform.

FIG. 7 is a trapezoidal approximation of the Fourier spectrum envelope representing harmonics present in the output current waveform of a CMOS driver. FIG. 7 assumes that the output waveform has a repetition period time T (and frequency F), an amplitude a, a pulse width $\tau$, and a transition rise time $\tau_r$. While these approximations are not always true (for example the output signal may not be periodic), they do provide insight into the relationship between transition rise time $\tau_r$ and harmonic amplitude. Essentially FIG. 7 shows that a doubling of transition rise time $\tau_r$ reduces the Fourier spectrum envelope 6 db for frequencies greater than $1/(\pi\tau_r)$.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE 1

Performance of Gradual Turn On vs Standard CMOS Output Buffer

| Condition | Parameter | Standard Buffer Pch | Standard Buffer Nch | GTO Buffer Pch | GTO Buffer Nch |
|---|---|---|---|---|---|
| 130C min 100 pf | delay (ns) TTL Vout | 11.5 | 25.4 | 22.8 | 24.6 |
| | delay (ns) CMOS .7VCC | 15.5 | — | 28.0 | — |
| | Iout peak current (ma) | 24.8 | 22.1 | 17.4 | 27.9 |
| | Iout rise (ns) 10–70% | 1 | 1 | 6.5 | 6.0 |
| | di/dt (ma/ns) 10–70% | 14.9 | 13.3 | 1.6 | 2.8 |
| 130C min 40 pf | delay (ns) TTL Vout | 5.5 | 11.0 | 14.5 | 14.7 |
| | delay (ns) CMOS .7VCC | 7.3 | — | 17.1 | — |
| | Iout peak current (ma) | 23.7 | 21.5 | 13.2 | 20.8 |
| | Iout rise (ns) 10–70% | 1 | 1 | 5.0 | 5.0 |
| | di/dt (ma/ns) 10–70% | 14.2 | 12.9 | 1.6 | 2.5 |
| 90C min 100 pf | delay (ns) TTL Vout | 10.4 | 22.5 | 21.4 | 22.0 |
| | delay (ns) CMOS .7VCC | 14.3 | — | 26.3 | — |
| | Iout peak current (ma) | 27.1 | 25.3 | 18.6 | 31.5 |
| | Iout rise (ns) 10–70% | 1 | 1 | 6.5 | 5.5 |
| | di/dt (ma/ns) 10–70% | 16.3 | 15.2 | 1.7 | 3.4 |
| 90C min 40 pf | delay (ns) TTL Vout | 5.0 | 9.7 | 13.5 | 13.0 |
| | delay (ns) CMOS .7VCC | 6.5 | — | 16.0 | — |
| | Iout peak current (ma) | 26.1 | 24.6 | 14.1 | 23.1 |
| | Iout rise (ns) 10–70% | 1 | 1 | 5.0 | 5.0 |
| | di/dt (ma/ns) 10–70% | 15.7 | 14.8 | 1.7 | 2.8 |
| −55C min 100 pf | delay (ns) TTL Vout | 3.5 | 9.0 | 7.5 | 8.4 |
| | delay (ns) CMOS .7VCC | 4.7 | — | 11.0 | — |
| | Iout peak current (ma) | 83.4 | 83.6 | 50.8 | 99.2 |
| | Iout rise (ns) 10–70% | 0.5 | 0.5 | 2.5 | 1.5 |
| | di/dt (ma/ns) 10–70% | 116.8 | 100.3 | 12.2 | 39.7 |
| −55C min 40 pf | delay (ns) TTL Vout | 1.8 | 4.0 | 4.7 | 4.7 |
| | delay (ns) CMOS .7VCC | 2.2 | — | 6.5 | — |
| | Iout peak current (ma) | 80.0 | 81.8 | 39.0 | 80.7 |
| | Iout rise (ns) 10–70% | 0.5 | 0.5 | 2.0 | 1.2 |
| | di/dt (ma/ns) 10–70% | 96.0 | 98.2 | 11.7 | 40.4 |

Conditions and CS100 device sizes:
min — VCC = 4.5v, slow process, Rt = 8.0K & Rout = 15.0 (GTO), Rs = 23.3 (Std)
max — VCC = 5.5v, fast process, Rt = 5.3K & Rout = 10.6 (GTO), Rs = 16.7 (Std)
Std Buffer — NAND P = 2 · 45/1 N = 2 · 32/1; P Driver = 388/1.1
NOR P = 2 · 45/1 N = 2 · 8/1; N Driver = 238/1.1 with Rsource
GTO Buffer — Predriver P = 2 · 60/1; P Driver = 350/1 with Rout
Predriver N = 2 · 12/1; N Driver = 275/1 with Rout
Predriver pass gate P = 12/1 N = 12/1 in series with Rt.

What is claimed is:

1. An integrated circuit CMOS 3-state driver, comprising:

an input port which receives an input signal, an enable port which receives an enable signal, and an output port which provides an output signal;

a CMOS inverter including an output PMOS device and an output NMOS device coupled in series between first and second power sources, said PMOS and NMOS output devices each including a gate and having a drain coupled to said output port;

delay means, including a resistor switchably coupled between said input port and said gates of said PMOS and NMOS output devices, for driving each said output device on more slowly than off; said resistor forming an RC delay circuit in conjunction with intrinsic capacitance present at said gates of said PMOS and NMOS output devices; and enabling means, including a switch coupled in series with said resistor between the enable port and said gates, for enabling said output devices when said enable signal is at a predefined voltage level; wherein said switch is coupled to said enable port so that said enable signal opens and closes said switch;

whereby said output signal at said output port has increased transition times and reduced harmonic content compared to an output signal generated by a CMOS driver without said delay means.

2. The CMOS 3-state driver of claim 1, wherein said resistor has a resistance between 1 KΩ and 10 KΩ.

3. The CMOS 3-state driver of claim 1, wherein said delay means and enabling means together comprise an input PMOS device, said resistor, said switch, and an input NMOS device coupled in series between said first and second power sources; said input PMOS and NMOS devices each including a gate coupled to said input port;

said input NMOS device having a drain coupled to said resistor and to said gate of said output NMOS device; and said input PMOS device having a drain coupled to said resistor and to said gate of said output PMOS device;

whereby, when said enable signal closes said switch and said input signal turns said input PMOS device off, said intrinsic capacitance at said gate of said output PMOS device charges relatively slowly through said resistor, causing said output PMOS device to turn on relatively slowly; and whereby, when said enable signal closes said switch and said input signal turns said input NMOS device off, said intrinsic capacitance at said gate of said output NMOS device charges relatively slowly through said resistor, causing said output NMOS device to turn on relatively slowly.

4. The CMOS 3-state driver of claim 1, wherein said resistor is a resistive circuit element selected from the group consisting of a polysilicon resistor, a P+ diffusion resistor, and an N+ diffusion resistor.

5. The CMOS 3-state driver of claim 1, wherein said enabling means includes a PMOS device and an NMOS device coupled in parallel between said resistor and said gate of one of said output devices.

6. An integrated circuit CMOS 3-state driver, comprising:

an input port which receives an input signal, an enable port which receives an enable signal, and an output port which provides an output signal;

a CMOS output stage, including an output PMOS device and an output NMOS device coupled in series between first and second power sources, said PMOS and NMOS output devices each including a gate and a drain coupled to said output port;

a CMOS input stage coupled to said CMOS output stage, said CMOS input stage including a second PMOS device, a resistor, a switch, and a second NMOS device coupled in series between first and second power sources; said resistor having resistance at least five times as large as said second PMOS device's on-channel resistance;

said second PMOS and second NMOS devices each including a gate coupled to said input port; said second PMOS device having a drain coupled to said gate of said output PMOS device; said second NMOS device having a drain coupled to said gate of said output NMOS device; and said switch being coupled to said enable port, wherein said enable signal opens and closes said switch;

wherein said resistor forms an RC delay circuit in conjunction with intrinsic capacitance present at said gates of said PMOS and NMOS output devices;

whereby said output signal at said output port has increased transition times and reduced harmonic content compared to an output signal generated by a CMOS driver without said resistor.

7. The CMOS 3-state driver of claim 5, wherein said resistor has a resistance between 1 KΩ and 10 KΩ.

* * * * *